US008636915B2

(12) United States Patent
Takiguchi et al.

(10) Patent No.: US 8,636,915 B2
(45) Date of Patent: Jan. 28, 2014

(54) LIQUID PROCESSING APPARATUS AND LIQUID PROCESSING METHOD

(75) Inventors: Yasushi Takiguchi, Koshi (JP); Taro Yamamoto, Koshi (JP); Tsutomu Yamahata, Koshi (JP); Akihiro Fujimoto, Koshi (JP); Kouji Fujimura, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 0 days.

(21) Appl. No.: 13/811,522

(22) PCT Filed: Jul. 12, 2011

(86) PCT No.: PCT/JP2011/065869
§ 371 (c)(1),
(2), (4) Date: Jan. 22, 2013

(87) PCT Pub. No.: WO2012/011411
PCT Pub. Date: Jan. 26, 2012

(65) Prior Publication Data
US 2013/0118533 A1      May 16, 2013

(30) Foreign Application Priority Data

Jul. 23, 2010   (JP) ................................. 2010-166067

(51) Int. Cl.
*B44C 1/22*       (2006.01)
*C03C 15/00*      (2006.01)
*C03C 25/68*      (2006.01)
*C23F 1/00*       (2006.01)

(52) U.S. Cl.
USPC .......................... 216/83; 156/345.11; 438/748

(58) Field of Classification Search
USPC ................. 216/83; 438/689, 748; 156/345.11
See application file for complete search history.

(56) References Cited

U.S. PATENT DOCUMENTS 5,250,114 A    10/1993   Konishi et al.
5,416,047 A     5/1995   Konishi et al.
(Continued)

FOREIGN PATENT DOCUMENTS

JP        04-118074 A1      4/1992
JP        2002-100556 A1    4/2002
(Continued)

OTHER PUBLICATIONS

International Search Report dated Aug. 16, 2011.

*Primary Examiner* — Roberts Culbert
(74) *Attorney, Agent, or Firm* — Burr & Brown, PLLC

(57) ABSTRACT

To provide a liquid processing apparatus capable of processing substrates with a high throughput with the lesser number of nozzles for chemical-liquid, when the substrates that are horizontally held in cup bodies are liquid-processed by supplying a chemical liquid to the substrates. Taking a developing process as an example of a liquid process, two-types of developing nozzles are prepared for two types of developing methods. The developing nozzle, which is used in the method in which the nozzle is engaged with the process for a longer period of time, is individually disposed on each of a first processing module 1 and a second processing module 2. On the other hand, the developing nozzle, which is used in the method in which the nozzle is engaged with the process for a shorter period of time, is used in common in the first liquid processing module 1 and the second liquid processing module 2. The common developing nozzle is configured to wait on an intermediate position between the modules 1 and 2.

10 Claims, 14 Drawing Sheets

(56) References Cited

U.S. PATENT DOCUMENTS

| | | |
|---|---|---|
| 2006/0162646 A1 | 7/2006 | Akimoto et al. |
| 2006/0162858 A1 | 7/2006 | Akimoto et al. |
| 2006/0189103 A1 | 8/2006 | Matsuoka et al. |
| 2009/0033898 A1 | 2/2009 | Yamamoto et al. |
| 2009/0214759 A1 | 8/2009 | Matsuoka et al. |

FOREIGN PATENT DOCUMENTS

| | | |
|---|---|---|
| JP | 2006-206075 A1 | 8/2006 |
| JP | 2006-229062 A1 | 8/2006 |
| JP | 2006-229183 A1 | 8/2006 |
| JP | 2009-033054 A1 | 2/2009 |

LIQUID PROCESSING APPARATUS AND LIQUID PROCESSING METHOD

TECHNICAL FIELD

The present invention relates to a liquid processing apparatus and a liquid processing method, for processing a substrate by supplying a chemical liquid onto a surface of the substrate from a nozzle.

BACKGROUND ART

A semiconductor manufacturing step includes a step in which a substrate is processed by supplying a chemical liquid onto a surface of the substrate. For example, a developing apparatus, which is provided in a coating and developing apparatus for forming a resist pattern, is configured to horizontally hold a substrate on a substrate holding part disposed in a cup that defines a processing area, and to supply a developer as a chemical liquid from a nozzle. After the developer has been supplied to the substrate, a dissoluble portion of a resist film is made unmoved for a time, e.g., for several tens seconds, required for the portion to be dissolved by the developer.

The following methods are known as a method of applying a developer onto a surface of a substrate.
(1) A method in which a nozzle is scanned along a surface of a substrate, the nozzle having an outlet of a length equal to or larger than a width of an effective area of the substrate.
(2) A method in which, while a substrate is being rotated, a nozzle having an outlet formed of a slit whose length is about several centimeters is moved from a peripheral portion of a substrate to a central portion thereof, with the nozzle discharging a developer.

It is required for a coating and developing apparatus to achieve a higher throughput, e.g., to process as much as 240 substrates per hour. In addition, preventing a contamination of substrates and reducing the number of components in order to simplify the apparatus are also required.

Patent Document 1 describes the following apparatus. In this apparatus, two cups are aligned in a right and left direction, and waiting pots are provided on both sides of the aligned cups. A developer is supplied to substrates loaded into the two cups, by means of one developer nozzle. In this apparatus, a deionized-water nozzle for rinsing is rotatably disposed on each cup.

Patent Document 2 describes a structure in which a developer nozzle waits at a center between two cups.

However, neither Patent Document 1 nor 2 considers that a chemical liquid is differently supplied corresponding to a kind (lot) of substrates. In addition, in the structure described in Patent Document 1, depending on a timing at which another substrate is loaded, since the developer nozzle is moved beyond a substrate that is stationary for development, there is a possibility that a developer falls down from the developer nozzle onto the stationary substrate, which invites a failure in development.

PATENT DOCUMENTS

[Patent Document 1] JP2002-100556A: FIG. 1
[Patent Document 2] JP4-118074A: FIG. 2

DISCLOSURE OF INVENTION

The present invention has been made in view of the above circumstances. The object of the present invention is to provide a liquid processing apparatus and a liquid processing method, capable of processing substrates with a high throughput, with the lesser number of nozzles for chemical liquid.

A liquid processing apparatus of the present invention is a liquid processing apparatus comprising:
a first processing area and a second processing area that are aligned such that substrates that are horizontally placed are respectively processed by a chemical liquid from a nozzle;
a first individual nozzle and a second individual nozzle that are provided individually to correspond to the first processing area and the second processing area;
a first individual-nozzle transfer mechanism and a second individual-nozzle transfer mechanism that are respectively configured to transfer the first individual nozzle and the second individual nozzle between waiting positions and chemical-liquid discharging positions in the respective processing areas;
a common nozzle that is used in common in the first processing area and the second processing area, the common nozzle being configured to supply the chemical liquid onto the substrates;
a common-nozzle transfer mechanism configured to transfer the common nozzle among a waiting position, a chemical-liquid discharging position in the first processing area and a chemical-liquid discharging position in the second processing area; and
a control unit configured to control the first individual-nozzle transfer mechanism, the second individual-nozzle transfer mechanism and the common-nozzle transfer mechanism;
wherein the control unit is configured to control the respective nozzle transfer mechanisms such that a time period in which the common nozzle is engaged with the process in each processing area is shorter than a time period in which the individual nozzle is engaged with the process in each processing area.

A liquid processing method of the present invention is a liquid processing method for processing substrates by a chemical liquid from a nozzle, the substrates being horizontally placed in a first processing area and a second processing area that are aligned with each other, the method comprising:
loading alternately a plurality of substrates of one lot, one by one, into the first processing area and the second processing area;
transferring a first individual nozzle individually provided to correspond to the first processing area from a waiting position to a chemical-liquid discharging position in the first processing area, and supplying the chemical liquid onto a whole surface of one substrate of the one lot so as to process the substrate;
transferring a second individual nozzle individually provided to correspond to the second processing area to a chemical-liquid discharging position in the second processing area, and supplying the chemical liquid onto the whole surface of another substrate of the one lot;
loading alternately a plurality of substrates of another lot, one by one, into the first processing area and the second processing area;
transferring a common nozzle, which is used in common in the first processing area and the second processing area, from a waiting position to a chemical-liquid discharging position in the first processing area, and supplying the chemical liquid onto one substrate of the other lot; and
transferring the common nozzle to a chemical-liquid discharging position in the second processing area, and supplying the chemical liquid onto another substrate of the other lot;

wherein a time period in which the common nozzle is engaged with the process in each processing area is shorter than a time period in which the individual nozzles are engaged with the process in each processing area.

EFFECT OF INVENTION

In the present invention, a substrate is processed by supplying a chemical liquid onto a whole surface of the substrate with the use of a first individual nozzle and a second individual nozzle that are provided individually to correspond to a first processing area and a second processing area. On the other hand, there is used a common nozzle common to the first processing area and the second processing area, when there is performed a liquid process in which the a time period in which the common nozzle is engaged with the process in each processing area is shorter than a time period in which the individual nozzle is engaged with the process in each processing area. Therefore, substrates can be processed with a high throughput, with the lesser number of nozzles for chemical liquid.

MODES FOR CARRYING OUT THE INVENTION

Figure 1:
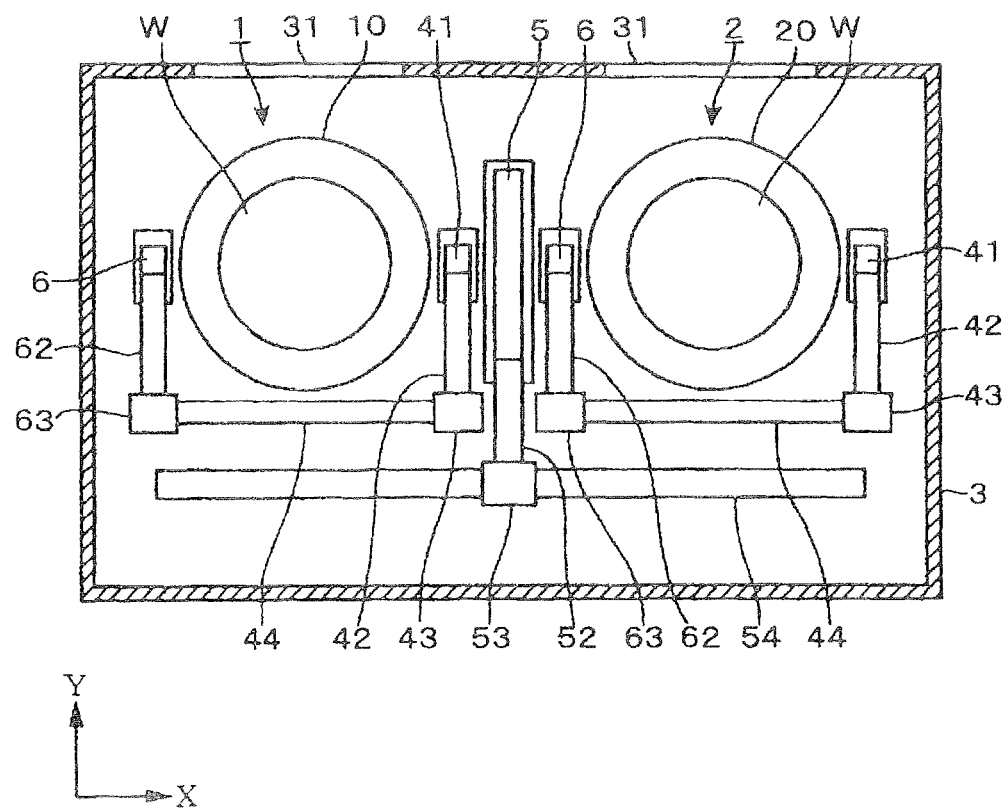
FIG. 1 is a schematic plan view of an overall liquid processing apparatus in an embodiment of the present invention.

There is described an embodiment in which a liquid processing apparatus of the present invention is applied to a developing apparatus that develops an exposed semiconductor wafer (hereinafter referred to as "wafer"). The developing apparatus includes a rectangular housing 3 in which two cup bodies 10 and 20 are arranged in an X direction. FIG. 1 schematically shows each of these cup bodies 10 and 20 by a circle depicted by a single line for convenience sake, but FIGS. 2 and 3 respectively show a concretely detailed structure thereof. The cup bodies 10 and 20 respectively constitute a first liquid processing module and a second liquid processing module, together with peripheral members and peripheral mechanism of the cup bodies 10 and 20. Since the liquid processing modules 1 and 2 have the same structure, the structure of the liquid processing module 1 is described.

Figure 2:
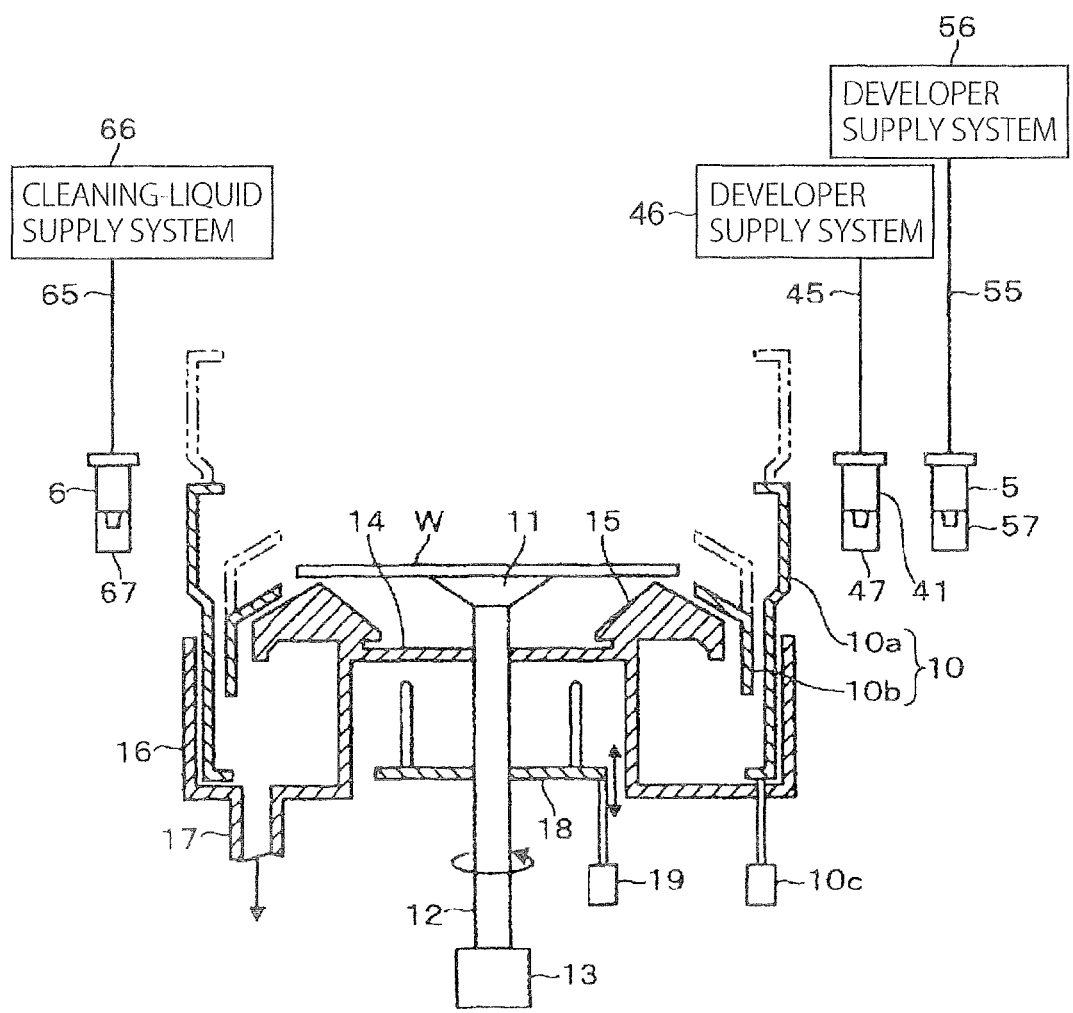
FIG. 2 is a longitudinal side view showing an inside of a cup body of the embodiment.
Figure 3:
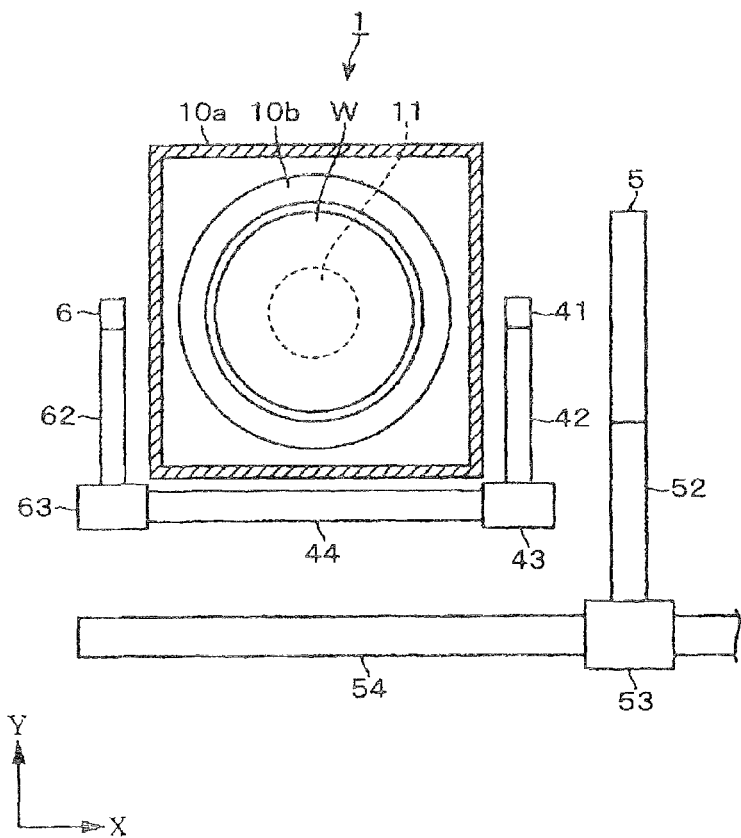
FIG. 3 is a plan view showing a part of the liquid processing apparatus.

In FIGS. 2 and 3, the reference number 11 depicts a spin chuck that constitutes a substrate holding part. The spin chuck 11 is capable of horizontally holding a substrate, e.g., a wafer W, by vacuum suction. As shown in FIG. 2, the spin chuck 11 is connected through a rotation shaft 12 to a rotation driving part, e.g., a spin motor 13, which is disposed below. Thus, the spin chuck 11 can be rotated about a vertical axis and can be elevated and lowered (moved upward and downward), with holding a wafer W.

In addition, the developing apparatus includes the cup body 10 which surrounds the wafer W held by the spin chuck 11. The cup body 10 is composed of an outer cup 10a and an inner cup 10b. An upper side of the cup body 10 is opened. As shown in FIG. 3, an upper part of the outer cup 10a is of a rectangular shape and a lower part thereof is of a cylindrical shape. As shown in FIG. 2, a lower end of the outer cup 10a has a stepped portion. The outer cup 10a can be elevated and lowered by an elevating part 10c disposed below. The inner cup 10b is of a cylindrical shape, with an upper part thereof being inclined inward. When the outer cup 10a is elevated or lowered, a lower end surface of the inner cup 10b is brought into contact with the stepped portion of the outer cup 10a so as to be pushed upward. In FIG. 1, illustration of the outer cup 10a is omitted, for avoiding complexity of FIG. 1. Upper areas of the cup bodies 10 and 20 including areas where wafers W are placed define a processing area. The processing area of the first liquid processing module 1 and the processing area of the second liquid processing module 2 correspond to a first processing area and a second processing area, respectively.

A circular plate 14 is disposed below the wafer W held by the spin chuck 11. Outside the circular plate 14, there is provided an umbrella-shaped guide member 15 whose longitudinal cross-section has a chevron shape. The umbrella-shaped guide member 15 is configured to introduce a developer and a cleaning liquid falling from the wafer W, to a liquid receiving part 16 described below. The liquid receiving part 16 is formed to have a recessed longitudinal cross-sectional shape. The liquid receiving part 16 is located below an outer periphery of the circular plate 14 along its whole circumference like a doughnut. A drain pipe 17 is connected from below to a bottom surface of the liquid receiving part 16. Although not shown, the drain pipe 17 is connected to a drain tank, and a gas-liquid separator is disposed on the drain pipe 17 so as to separate an exhaust gas and a waste liquid.

As shown in FIG. 2, the developing apparatus includes a plurality of, e.g., three elevating pins 18 below the circular plate 14. The elevating pins 18 are capable of being elevated and lowered by an elevating pin elevating mechanism 19 connected to the elevating pins 18. When a wafer W is transferred, the elevating pins 18 are elevated by passing through the circular plate 14 from below, so as to assist transfer of the wafer W between a not-shown substrate transfer arm and the spin chuck 11.

The first liquid processing module 1 includes an individual developing nozzle 41 which is individually (dedicatedly) provided to the liquid processing module 1, and a common developing nozzle 5 which is used in common (shared) with the second liquid processing module 2 adjacent to the liquid processing module 1. The individual developing nozzle 41 and the common developing nozzle 5 respectively correspond to an individual nozzle and a common nozzle recited in the claims.

As shown in FIGS. 1 and 3, the individual developing nozzle 41 is held by a nozzle arm 42 extending in a Y direction. The nozzle arm 42 is configured to be movable in the X direction by a nozzle transfer mechanism 43. The nozzle arm 42 transfers the individual developing nozzle 41 between a waiting position, which is set on a right-side position near to the cup body 10 as shown in FIGS. 1 and 3, and a developer discharging position at which a developer is supplied to a wafer W on the spin chuck 11. The nozzle transfer mechanism 43 is composed of a guide member 44 extending in the X direction, and a driving mechanism, such as a ball screw mechanism, for moving the individual developing nozzle 41 along the guide member 44.

As shown in FIGS. 1 and 3, the common developing nozzle 5 is held by a nozzle arm 52 extending in the Y direction. The nozzle arm 52 is configured to be movable in the X direction by a nozzle transfer mechanism 53. The nozzle arm 52 transfers the common developing nozzle 5 between a waiting position, which is set at an intermediate position between the cup body 10 and the cup body 20 as shown in FIGS. 1 and 3, and a developer discharging position at which a developer is supplied to a wafer W on the spin chuck 11. The nozzle transfer mechanism 53 is composed of a guide member 54 extending in the X direction, and a driving mechanism, such as a ball screw mechanism, for moving the common developing nozzle 5 along the guide member 54.

Although the developing nozzles 41 and 5 are respectively held below the nozzle arms 42 and 52, FIGS. 1 and 3 draw the developing nozzles 41 and 5 as if they were positioned on the distal end portions of the nozzle arms 42 and 52, as a matter of convenience in explanation. As shown in FIG. 2, the developing nozzles 41 and 5 are connected to developer supply systems 46 and 56 through flexible pipes 45 and 55. The developer supply system 46 (56) includes supply control equipments such as a developer storage tank, a pump, a valve and so on.

Figure 4:
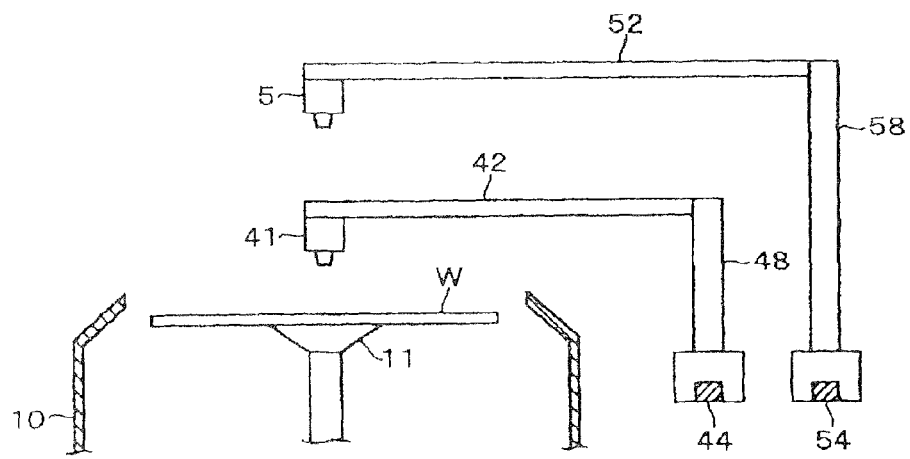
FIG. 4 is a longitudinal side view showing an individual developing nozzle and a common developing nozzle.

As shown in FIG. 4, the nozzle transfer mechanisms 43 and 53 includes columns 48 and 58 that are moved while being guided by the guide members 44 and 54. The nozzle arms 42 and 52 are disposed on the columns 48 and 58 such that the nozzle arms 42 and 52 can be elevated and lowered by elevating mechanisms, not shown. The nozzle arm 52 of the common developing nozzle 5 can be set at a position higher than a position of the nozzle arm 41 of the individual developing nozzle 42. Thus, the common developing nozzle 5 can be horizontally moved beyond the individual developing nozzle 41.

Figure 5:
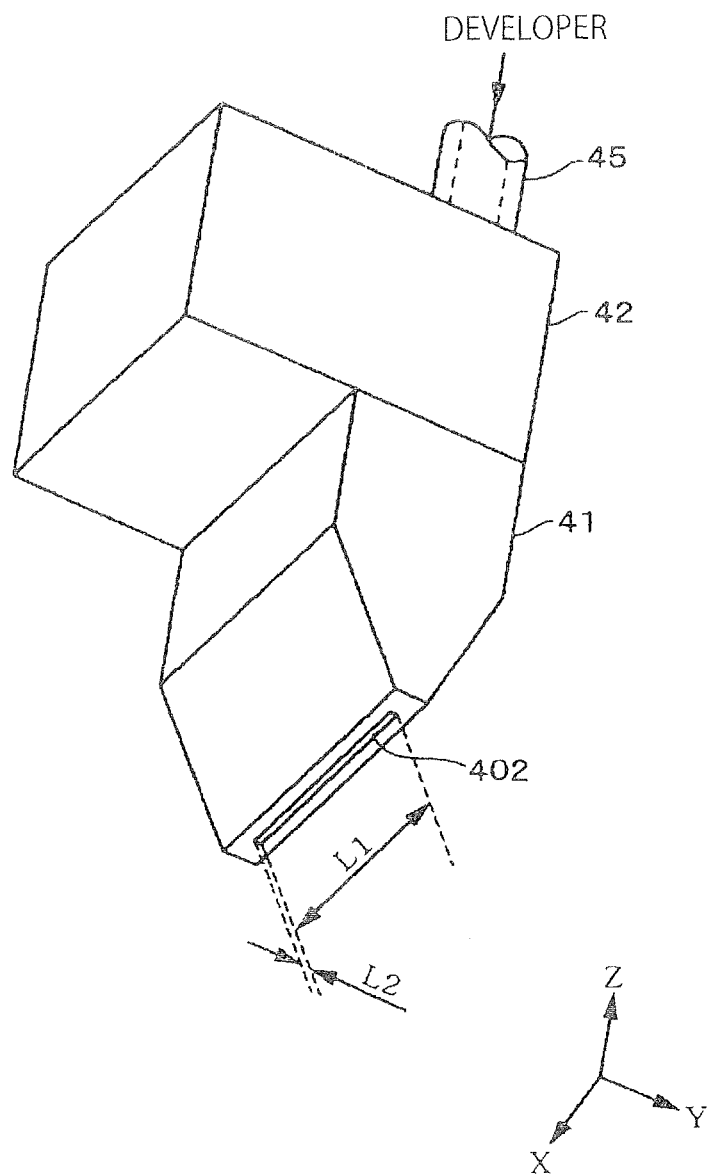
FIG. 5 is a perspective view showing the individual developing nozzle.

As shown in FIG. 5, the individual developing nozzle 41 has, in the Y direction in FIG. 5, a width that gradually reduces toward a distal end thereof. In a lower end surface (distal end surface) of the individual developing nozzle 41, there is formed a strip-like discharge opening 402 having a length L1 of 8 to 15 mm and a width L2 of 0.1 to 1 mm, for example.

Figure 6:
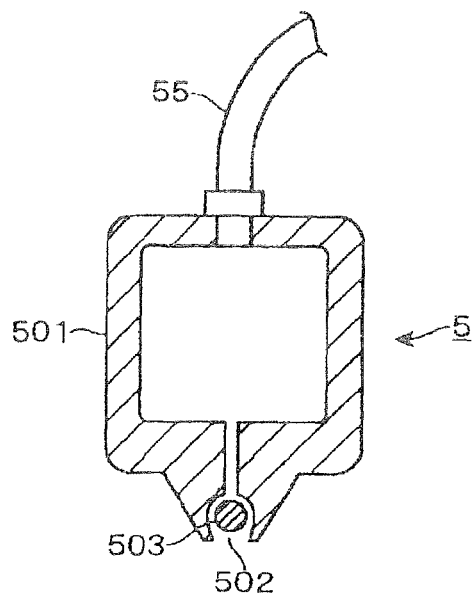
FIG. 6 is a longitudinal sectional view of the common developing nozzle.
Figure 7:
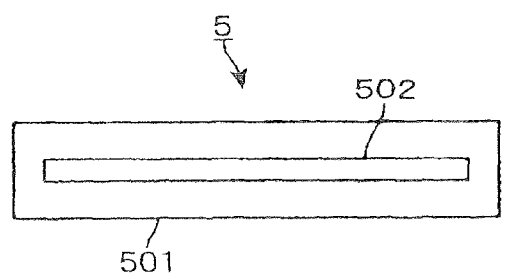
FIG. 7 is a plan view showing a distal end of the common developing nozzle.

As shown in FIGS. 6 and 7, the common developing nozzle 5 includes a nozzle body 501 that is longer than a diameter of a wafer W, a discharge opening 502 formed in a lower surface of the nozzle body 501 such that the discharge opening 502 is in communication with a liquid circulation chamber in the nozzle body 501, and a buffer rod 503 accommodated in the discharge opening 502. FIG. 7 illustrates that the discharge opening 502 has a slit-like shape. However, the discharge opening 502 may be a number of holes that are arranged with intervals therebetween in a longitudinal direction of the nozzle body 501. The length of the discharge opening 502 is set so as to cover an effective area of a wafer W (device formation area).

The individual developing nozzle 41 and the common developing nozzle 5 supply a developer as a chemical liquid, in methods different from each other. A time period (used time period) in which the individual developing nozzle 41 is engaged with the process in the processing area (exclusively used for the process in the processing area) for processing one wafer W is longer than a time period (used time period) in which the common developing nozzle 5 is engaged with the process in the processing area (occupies the processing area) for processing one wafer W. The developing methods of the nozzles 41 and 5 are schematically described. The individual developing nozzle 41 moves from a peripheral portion of the wafer W to a central portion thereof, while the wafer W is being rotated, so as to spirally apply the developer as a chemical liquid, and then continuously discharges the developer from a position above the central portion of the wafer W for a predetermined period of time. The common developing nozzle 5 supplies the developer as a chemical liquid onto the wafer W while scanning the wafer W from one end thereof to the other end thereof, so as to form a puddle of the developer.

In FIG. 1, the reference number 6 depicts a nozzle for cleaning a wafer W by supplying a cleaning liquid formed of, e.g., deionized water, onto the wafer W on which the developer has been supplied. As shown in FIGS. 1 and 3, the cleaning nozzle 6 is held by a nozzle arm 62 extending in the Y direction. The nozzle arm 62 is configured to be movable in the X direction by a nozzle transfer mechanism 63. The nozzle arm 62 transfers the cleaning nozzle 6 between a waiting position, which is set on a left-side position near to the cup body as shown in FIGS. 1 and 3, and a cleaning-liquid discharging position at which a cleaning liquid is supplied to a wafer W on the spin chuck. The nozzle transfer mechanism 63 uses the guide member 44 in common with the nozzle transfer mechanism 43. The nozzle transfer mechanism 63 includes a driving mechanism, such as a ball screw mechanism, for moving the cleaning nozzle 6 along the guide member 44. As shown in FIG. 2, the cleaning nozzle 6 is connected to a cleaning-liquid supply system 66 through a flexible pipe 65. In order that the developer on the wafer W can be well cleaned, the liquid processing modules 1 and 2 may be individually provided with a gas nozzle for blowing a gas, such as nitrogen gas, onto the wafer W.

The nozzle transfer mechanism 63 also has the nozzle arm 62 that is disposed on a column 68 such that the nozzle arm 62 can be elevated and lowered by an elevating mechanism, not shown. Thus, the nozzle arm 52 of the common developing nozzle 5 can be moved beyond the nozzle arm 62 of the cleaning nozzle 6.

In the waiting positions of the nozzles 41, 5 and 6, there are provided nozzle bathes 47, 57 and 67 in which the distal ends of the respective nozzles 41, 5 and 6 are fitted. The nozzle bathes 47, 57 and 67 respectively have drain openings.

Returning to FIGS. 1 and 2, loading and unloading openings 31, through which wafers W are loaded to and unloaded from the respective liquid modules 1 and 2 by an external transfer arm, are formed in a side surface of the housing 3. Further, shutters (not shown) for opening and closing the respective loading and unloading openings 31 are disposed.

Figure 8:
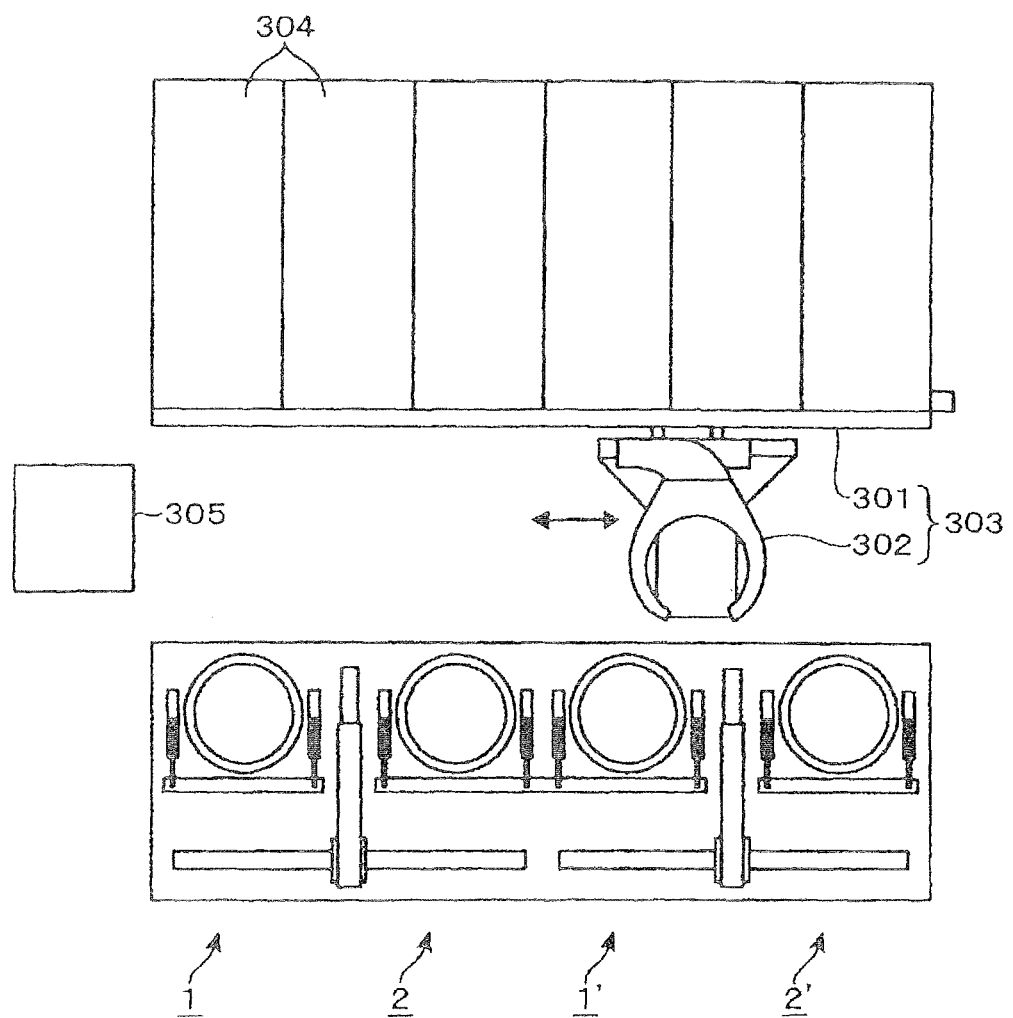
FIG. 8 is a plan view showing an example in which the liquid processing apparatus is incorporated in a processing block of a coating and developing apparatus.

FIG. 8 shows a structural example of a part of a coating and developing apparatus including the liquid processing apparatus. In this example, there is provided a wafer transfer mechanism 303 including a moving body 302 that moves along a main transfer path 301. The wafer transfer mechanism 303 is configured to be movable about the vertical axis, movable upward and downward, and movable forward and rearward. Four liquid processing modules 1, 2, 1' and 2' are aligned along the main transfer path 301. The liquid processing modules 1' and 2' have the same structure as that of the liquid processing modules 1 and 2. On a side opposite to the liquid processing modules 1, 2, 1 and 2' with respect to the main transfer path 301, there are arranged a plurality of, e.g., six heating modules 304 in this example, along the main transfer path 301. The group of heating modules 304 include a heating module for heating a wafer W that has been already exposed but is not developed yet, and a heating module for heating a wafer W that has been developed. The wafer transfer mechanism 303 sends and receives a wafer W to and from the liquid processing modules 1, 2, 1' and 2' and the heating modules 304. The reference number 305 depicts a stage through which a wafer W is sent and received to and from another processing block.

Figure 9:
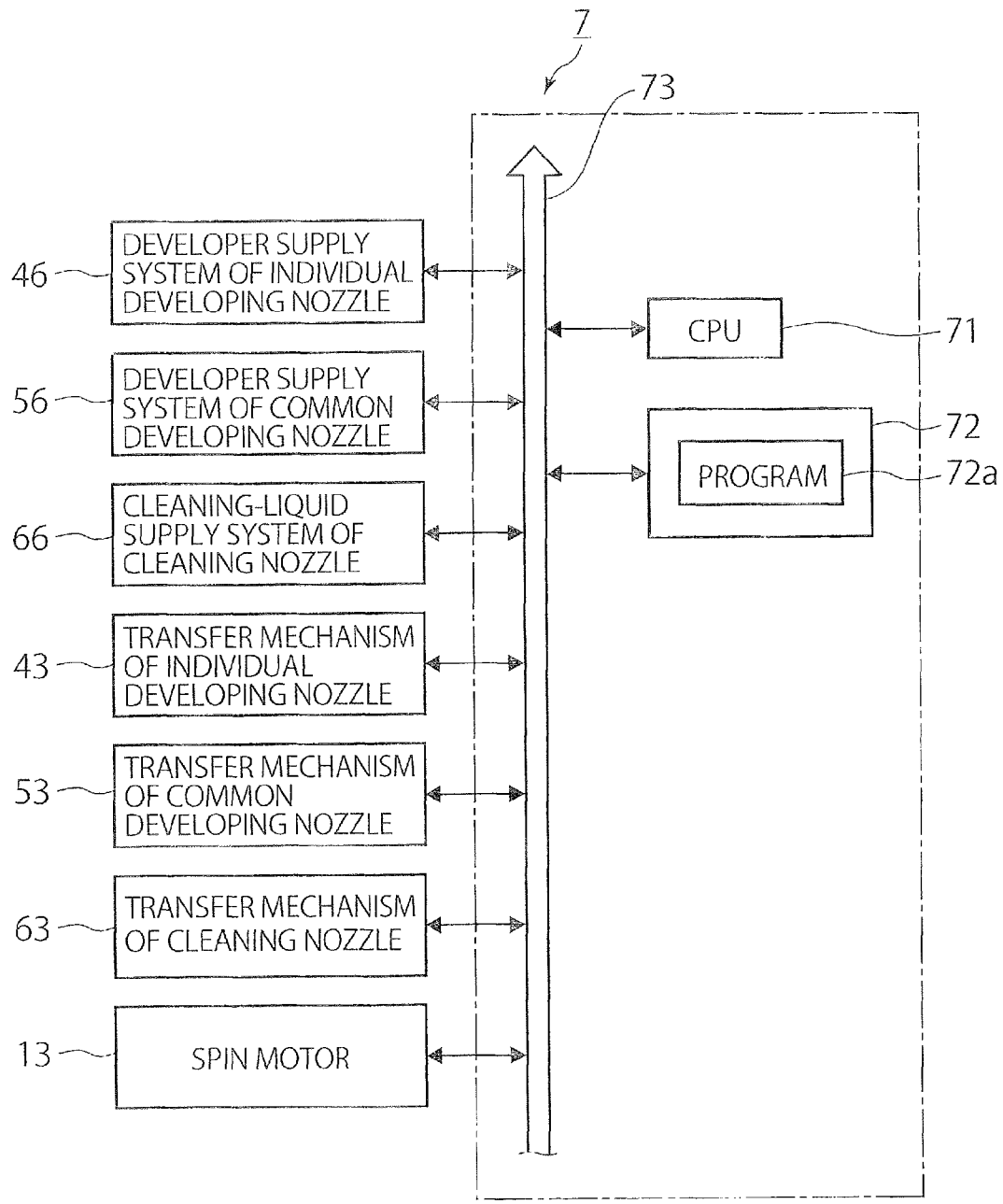
FIG. 9 is a structural view showing a control unit in an embodiment of the present invention.

FIG. 9 shows a control unit 7 for controlling the respective units of the developing apparatus. The control unit 7 is a computer composed of, e.g., a CPU 71, a program 72a stored in a program storage part 72, a data bus 73 and so on. Based on a process recipe, the program 72a controls the developer supply system 46 of the individual developer nozzle, the developer supply system 56 of the common developer nozzle, the cleaning-liquid supply system 66 of the cleaning nozzle, the transfer mechanism 43 of the individual developing nozzle, the transfer mechanism of the common developing nozzle, the transfer mechanism 63 of the cleaning nozzle, and the spin motor 13.

Figure 10:
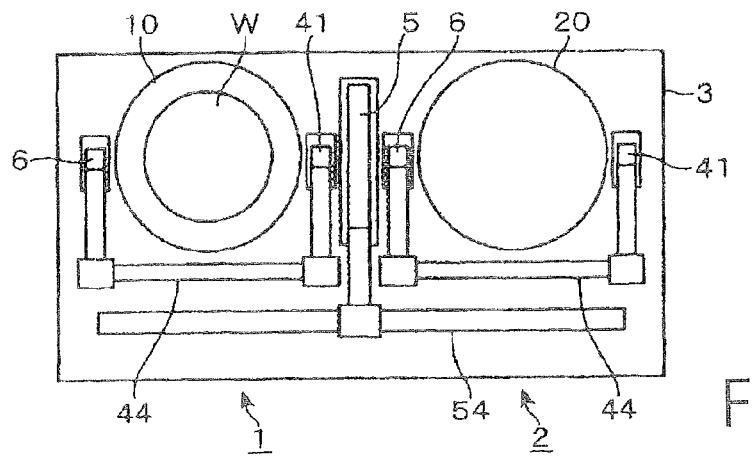
FIG. 10 is a schematic plan view showing an operation of the liquid processing apparatus.
Figure 11:
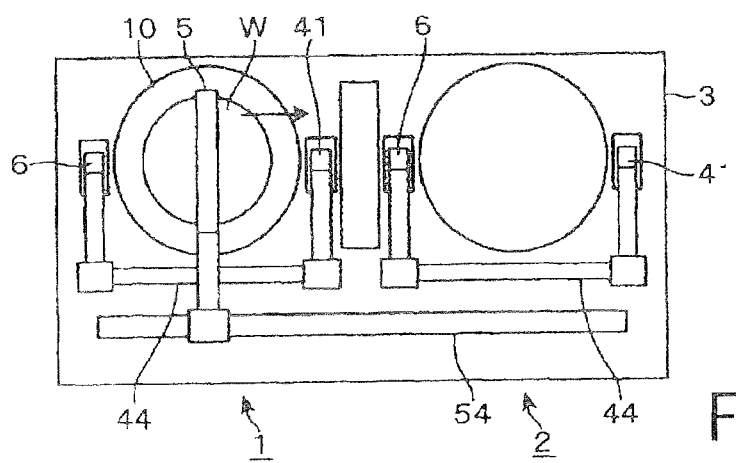
FIG. 11 is a schematic plan view showing an operation of the liquid processing apparatus.
Figure 14:
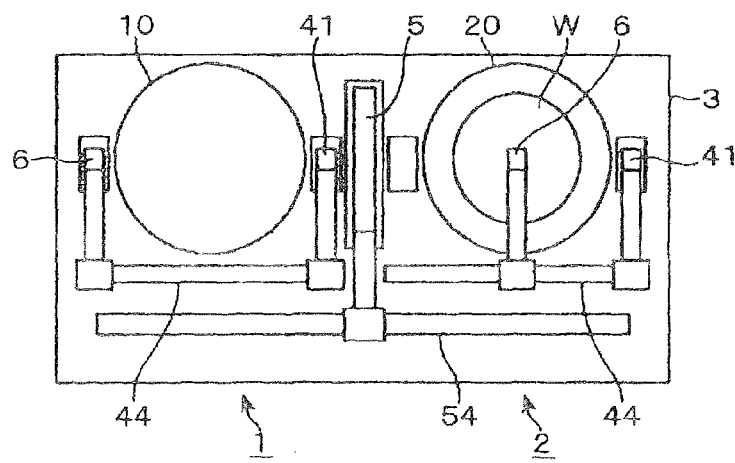
FIG. 14 is a schematic plan view showing the operation of the liquid processing apparatus.
Figure 15:
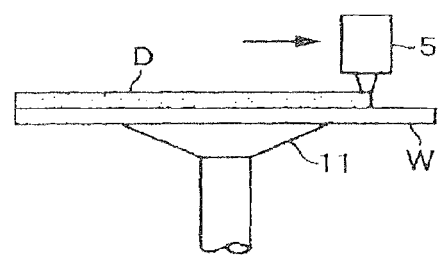
FIG. 15 is a schematic side view showing the operation of the liquid processing apparatus.
Figure 16:
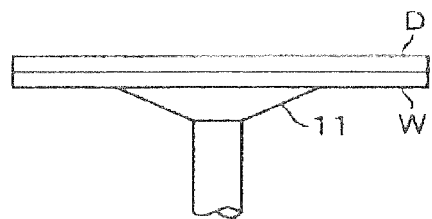
FIG. 16 is a schematic side view showing the operation of the liquid processing apparatus.
Figure 17:
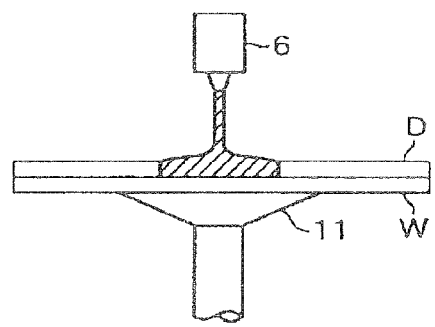
FIG. 17 is a schematic side view showing the operation of the liquid processing apparatus.
Figure 18:
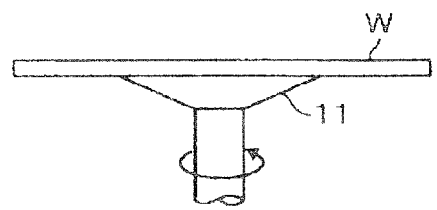
FIG. 18 is a schematic side view showing the operation of the liquid processing apparatus.

Next, an operation of the aforementioned embodiment is described with reference to FIGS. 10 to 26. The following operations are performed based on the program of the control unit 7. Now, FIG. 10 shows that a wafer W, which is a substrate of a certain lot, is loaded into the spin chuck 11 of the first processing module 1 by an external wafer transfer mechanism such as the wafer transfer mechanism 303 shown in FIG. 8. The loading operation of the wafer W is performed by a cooperation of the wafer transfer mechanism 303 and the elevating pins 18. Then, the common developing nozzle 5 is moved from the waiting position to one side of the wafer W by the nozzle transfer mechanism 53. The common developing nozzle 5 is moved from the one side of the wafer W to the other side thereof while a developer is being discharged from the discharge opening 502. Thus, the whole surface of the wafer W is supplied with the developer, so that a puddle of developer is formed on the wafer W. FIGS. 15 and 16 show the developer application by scanning. FIG. 11 shows that the common developing nozzle 5 passes through a position above the central portion of the wafer W. In FIGS. 15 and 16, the reference character D depicts the developer.

Figure 12:
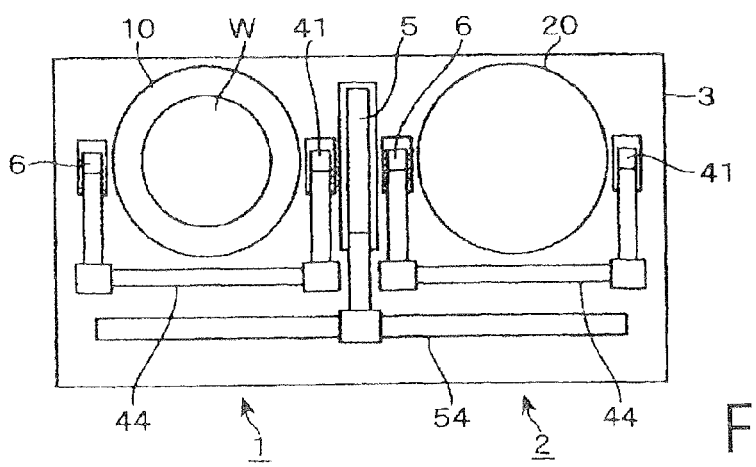
FIG. 12 is a schematic plan view showing the operation of the liquid processing apparatus.
Figure 13:
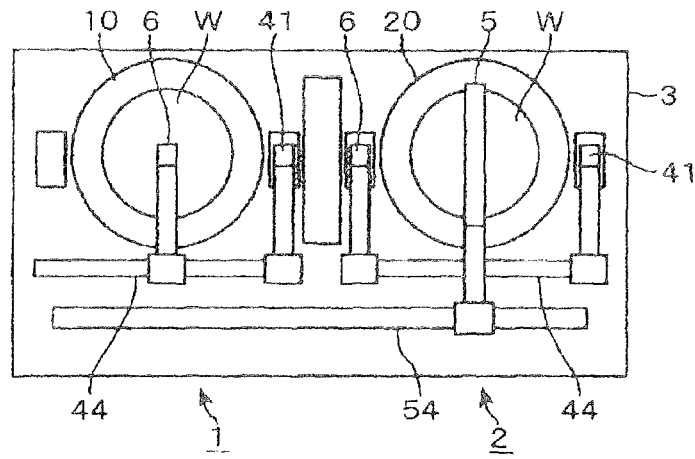
FIG. 13 is a schematic plan view showing the operation of the liquid processing apparatus.

The wafer W having the puddle of developer thereon is kept still as it is, until a set period (e.g., 30 seconds to 40 seconds) elapses. Then, as shown in FIG. 12, the common developing nozzle 5 is returned to the waiting position. After the set time has elapsed, as shown in FIG. 13, the cleaning nozzle 6 is moved from the waiting position to a position above the central portion of the wafer W by using the nozzle transfer mechanism 63. A deionized water is then discharged from the cleaning nozzle 6. Simultaneously, the wafer W is rotated by the spin motor, so that the deionized water is spread by the centrifugal force to remove the developer from the surface of the wafer W (see FIGS. 17 and 18). In this case, the discharging position of the deionized water from the cleaning nozzle 6 may be moved from the central portion of the wafer W to the peripheral portion thereof, and a gas may be blown from a gas nozzle onto a position on the downstream side of the discharging position in the rotational direction. Owing to this operation, the cleaning effect can be improved. Thereafter, the wafer W is rotated at a high speed to spin off the cleaning liquid so as to be dried (spin drying).

While the wafer W is being cleaned in the first liquid processing module 1, as shown in FIG. 13, a subsequent wafer W is loaded into the spin chuck of the second liquid processing module 2. Then, a puddle of developer is similarly formed by using the common developing nozzle 5. Further, in the second liquid processing module 2, after a set period required for a so-called stationary development has elapsed after the formation of the paddle of developer, as shown in FIG. 14, the surface of the substrate is similarly cleaned by using the cleaning nozzle 6 individually disposed on the liquid processing module 2. At this time, the cleaning of the wafer W in the first liquid processing module 1 has been already finished and the wafer W has been unloaded to the outside. The loading interval of wafers W varies, depending on the number of liquid processing modules, a processing time of another processing module, the layout of the apparatus or the like. However, in this example, a time sequence, starting from when the common developing nozzle 5 is moved from the waiting position to the position above the wafer W so as to apply the developer by scanning, until the common developing nozzle 5 is returned to the original waiting position, namely, a time period in which the common developing nozzle 5 is engaged with the process in the first liquid processing module 1, which includes the time in which the common developing nozzle 5 is transferred between the waiting position and the position above the wafer W, is shorter than the loading interval of wafers W by the wafer transfer mechanism.

The above explanation is a case in which the process is performed with the use of the common developing nozzle 5. Next, there is described a case in which a substrate of a lot different from the above lot is developed by using the individual developing nozzle 41.

Figure 19:
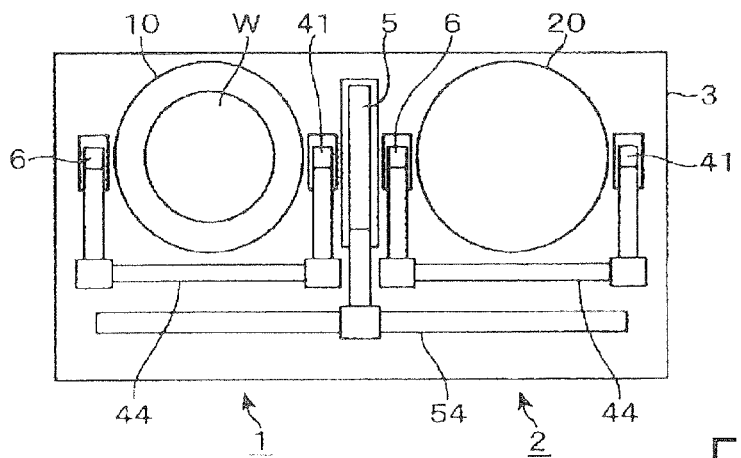
FIG. 19 is a schematic plan view showing the operation of the liquid processing apparatus.
Figure 20:
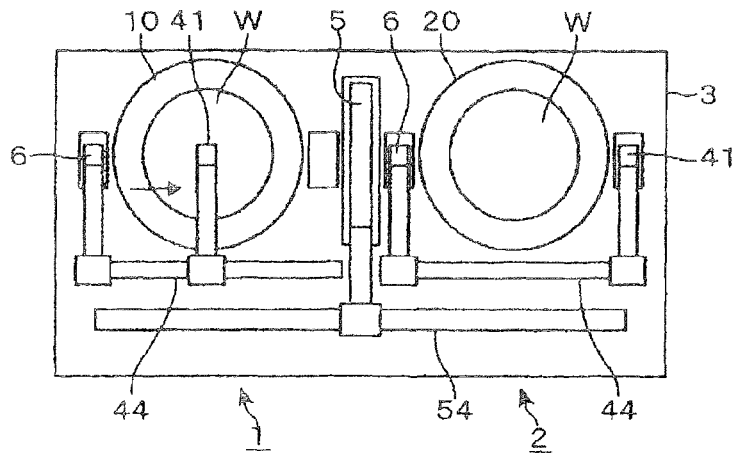
FIG. 20 is a schematic plan view showing the operation of the liquid processing apparatus.
Figure 24:
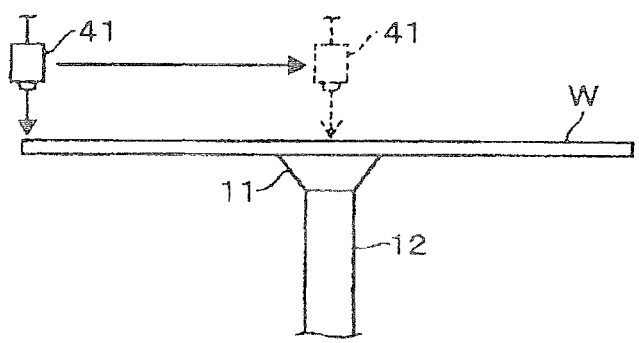
FIG. 24 is a schematic side view showing the operation of the liquid processing apparatus.

FIG. 19 shows that a wafer W which is a substrate of the different lot is loaded into the spin chuck 11 of the first processing module 1 by the external wafer transfer mechanism. The individual developing nozzle 41 is moved from the waiting position to one side of the wafer W by using the nozzle transfer mechanism 43, and the spin chuck 11 is rotated at, e.g., 500 rpm. A horizontal orientation of the nozzle 41 is set such that the length direction of the slit-like discharge opening 402 corresponds to a line connecting between the peripheral portion of the wafer W and the central portion thereof. The discharging position of the developer is moved from the periphery of the wafer W to the central portion thereof, while the developer is being discharged from the individual developing nozzle 41. As a result, the developer is supplied in a strip-like manner, and a puddle of developer is spirally formed. FIG. 24 shows this process. FIG. 20 shows that the individual developing nozzle 41 reaches the position above the central portion of the wafer W.

Figure 25:
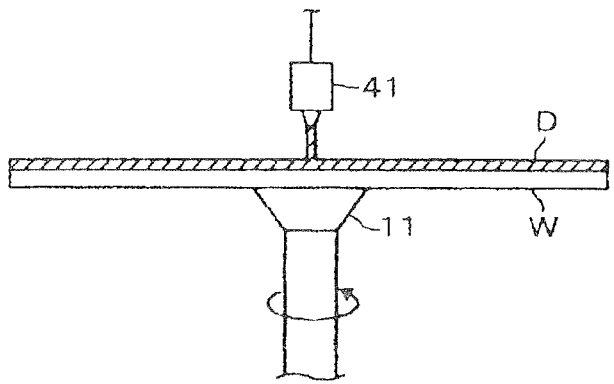
FIG. 25 is a schematic side view showing the operation of the liquid processing apparatus.
Figure 26:
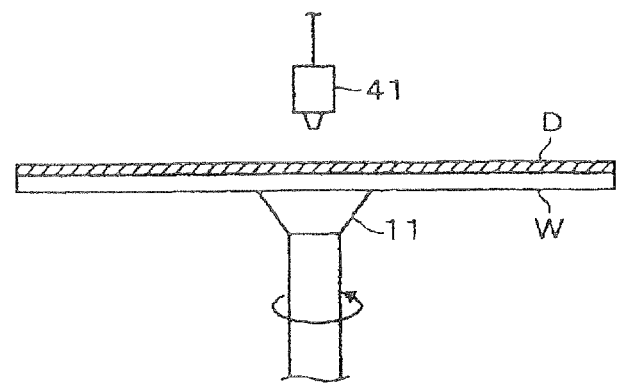
FIG. 26 is a schematic side view showing the operation of the liquid processing apparatus.

After that, the rotational speed of the wafer W is decreased down to, e.g., 100 rpm, such that the developer is gradually spread toward the periphery. Under this state, by continuously using the individual developing nozzle 41, the developer is supplied onto the central portion of the wafer W (FIG. 25). Then, while continuing the supply of the developer, the rotational speed of the wafer W is increased up to 2000 rpm, for example. Thereafter, the supply of the developer is stopped, and the rotational speed of the wafer W is decreased down to a rotational speed at which the developer is not drawn back from the peripheral portion of the wafer W by the surface tension but the paddle of developer can be held. This state is maintained at, e.g., about 40 seconds (FIG. 26).

Figure 21:
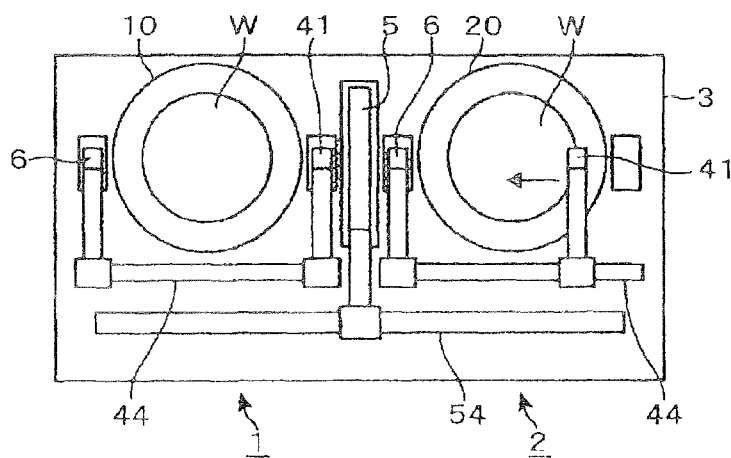
FIG. 21 is a schematic plan view showing the operation of the liquid processing apparatus.
Figure 22:
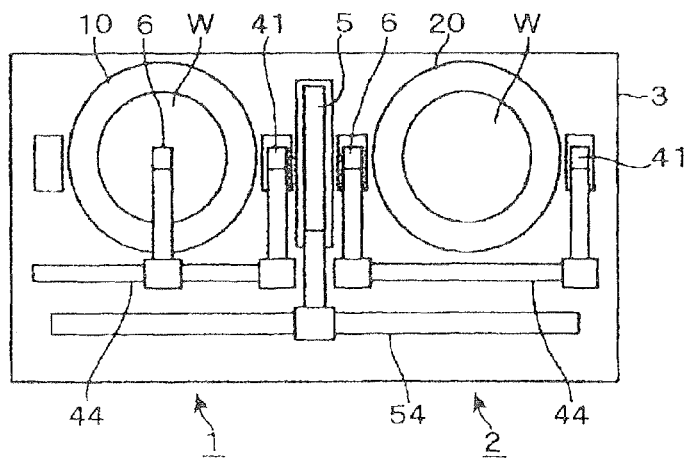
FIG. 22 is a schematic plan view showing the operation of the liquid processing apparatus.

On the other hand, while the developing process is being performed in the first liquid processing module 1, a subsequent wafer W is loaded into the spin chuck of the second liquid processing module 2. As shown in FIG. 21, the individual developing nozzle 41 in the module 1 is transferred from the waiting position to one side of the wafer W by the nozzle transfer mechanism 43. The wafer W in the second liquid processing module 2 is also subjected to the same process as the developing process explained for the first liquid processing module 1. At this time, in the first liquid processing module 1, a stationary time subsequent to the supply of the developer has already elapsed. As shown in FIG. 22, in the first liquid processing module 1, similarly to the cleaning process after the developing process, which is performed by using the aforementioned common developing nozzle 5, the developer on the wafer W is removed by the cleaning nozzle 6 so that the wafer W is cleaned. Further, the spin drying is performed.

Figure 23:
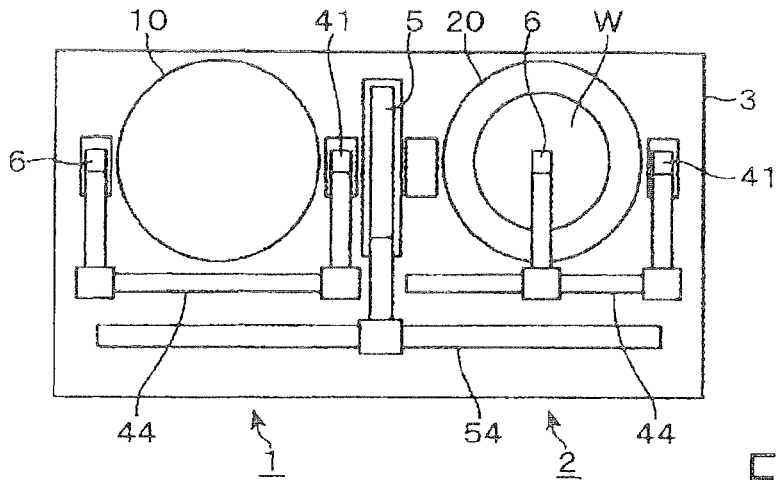
FIG. 23 is a schematic plan view showing the operation of the liquid processing apparatus.

After the series of processes to the wafer W in the first liquid processing module 1 is finished, the wafer W is unloaded. On the other hand, in the second liquid processing module 2, after the developing process has been finished, the wafer W is cleaned by the cleaning nozzle 6, and is then spin-dried (FIG. 23).

As described above, in this embodiment, there can be performed the method in which the developing process is performed with the use of the common developing nozzle 5, and the method in which the developing process is performed with the use of the individual developing nozzle 41. The method using the individual developing nozzle 41 is advantageous in that a uniform development can be realized even when water repellency of a resist film is high. Thus, when the water repellency of a resist film is low, the method using the common developing nozzle 5 is advantageous in that an amount of developer to be used in this method is less than the method using the individual developing nozzle 41. However, either one of the methods to be used is selected depending on a process time, a kind of a resist film, a cost of the developer, etc.

According to the above-described embodiment, the two types of developing nozzles are prepared for the two types of developing methods. The developing nozzle, which is used in the method in which the nozzle is engaged with the process for a longer period of time, is individually disposed on each of the first liquid processing module 1 and the second liquid processing module 2. On the other hand, the developing nozzle, which is used in the method in which the nozzle is engaged with the process for a shorter period of time, is used in common in the first liquid processing module 1 and the second liquid processing module 2. Thus, the number of the nozzles can be reduced because the nozzle is used in common. In addition, since the nozzles which are engaged with the process for a longer period of time are individually provided on the liquid processing modules, when wafers W are sequentially loaded into the first liquid processing module 1 and the second liquid processing module 2 at a short loading interval therebetween, a process to the loaded wafer W can be immediately started. As a result, a high throughput can be maintained.

Modifications of the present invention are described herebelow.

The developing method is not limited to the aforementioned method, and a wafer W may be developed in the following method. Namely, the common developing nozzle 5 is set on a position near to a surface of the wafer W, e.g., a position distant from the surface of the wafer W by about 1 mm and is above the diameter of the wafer W. With discharging a developer from the common developing nozzle 5, a puddle of developer is formed on the wafer W by rotating the wafer W at 180 degrees.

In the above embodiment, the function of the common developing nozzle 5 and the individual developing nozzle 41 is not limited to the supply of the developer. The common developing nozzle 5 may be configured to supply a thinner (organic solvent) onto the surface of the wafer W, and the individual developing nozzle 41 may be configured to supply a developer onto the wafer W. In this case, the common developing nozzle 5 facilitates spreading of the developer by previously wetting the whole surface of the wafer W with a thinner. This individual developing nozzle 41 may either be the same as the individual developing nozzle 41 in the aforementioned embodiment, or be the same as the common developing nozzle 5 in the aforementioned embodiment. In addition, in order to cope with the above two types of developing methods, there may be provided two developing nozzles as the individual developing nozzles.

Further, in a case where the waiting position of the common developing nozzle 5 is set between the first liquid processing module 1 and the second liquid processing module 2, unlike a case where the waiting position of the common developing nozzle 5 is located on an end side of the aligned liquid processing modules 1 and 2, the common developing nozzle 5 will not be moved beyond a wafer W that is being developed. Thus, the former structure is advantageous in that there is no possibility that the developer falls down on the wafer W that is being developed, and that the nozzles 41 and 5 and the nozzle arms 42 and 52 are contaminated by an atmosphere in each cup body. However, the waiting position of the common developing nozzle 5 may be set in the latter structure. In addition, for example, the individual developing nozzle 41 is not linearly moved between the waiting position and the processing position, but may be turned and moved therebetween.

Figure 27:
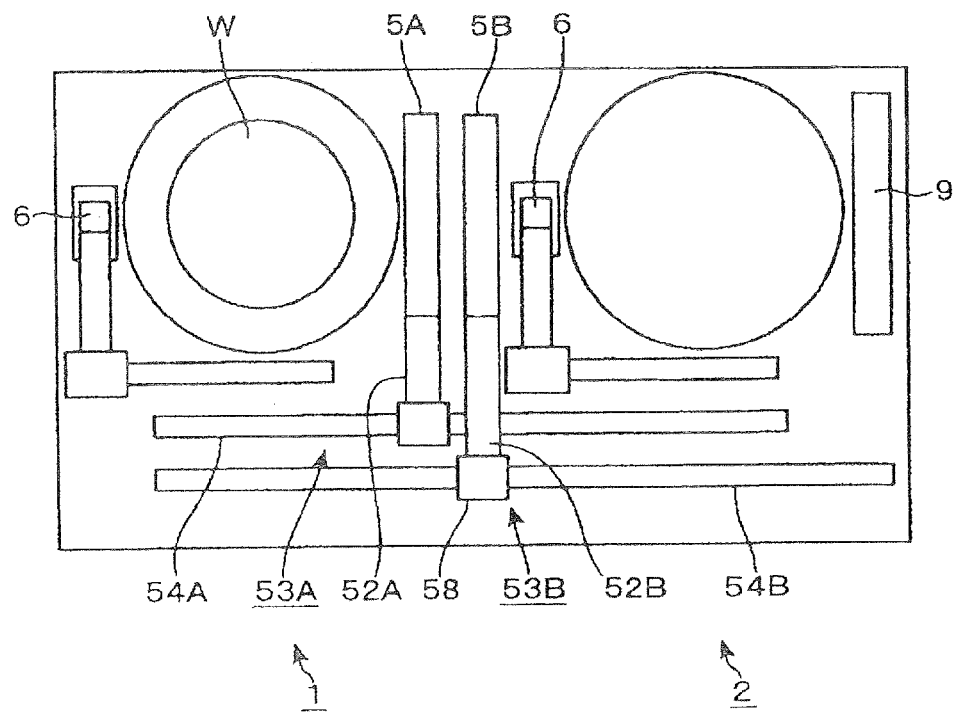
FIG. 27 is a plan view showing an example of another embodiment of the present invention.

Further, another example of the structure of the common developing nozzle 5 is described. FIG. 27 shows an example in which two common developing nozzles 5A and 5B are disposed. In this example, nozzle arms 52A and 52B respectively holding the common developing nozzles 5A and 5B are transferred by separate guide members 54A and 54B. These guide members 54A and 54B are arranged in parallel with each other on one side of the aligned first liquid processing module 1 and the second liquid processing module 2. The reference numbers 53A and 53B depict nozzle transfer mechanisms. As shown in FIG. 4, in the nozzle transfer mechanisms 53A and 53B, nozzle arms 52A and 52B are respectively provided on columns 58A and 58B so as to be elevated and lowered. When the nozzle arm 52B can be moved to a position higher than the nozzle arm 52A and the common developing nozzle 5B is used for the first liquid processing module 1, the common developing nozzle 5B is moved ahead of the common developing nozzle 5A. When the common developing nozzle 5A is used for the second liquid processing module 2, the common developing nozzle 5B is retracted to a waiting position 9 (retracted position) located on the right side of the second liquid processing module 2. The common developing nozzles 5A and 5B shown in FIG. 27 are located on the waiting positions. Although not shown, waiting buses are respectively disposed below the common developing nozzles 5A and 5B. In one example of the use of the common developing nozzles 5A and 5B, one nozzle is configured to discharge a developer containing a surfactant, and the other nozzle is configured to discharge a developer not containing any surfactant.

Figure 28:
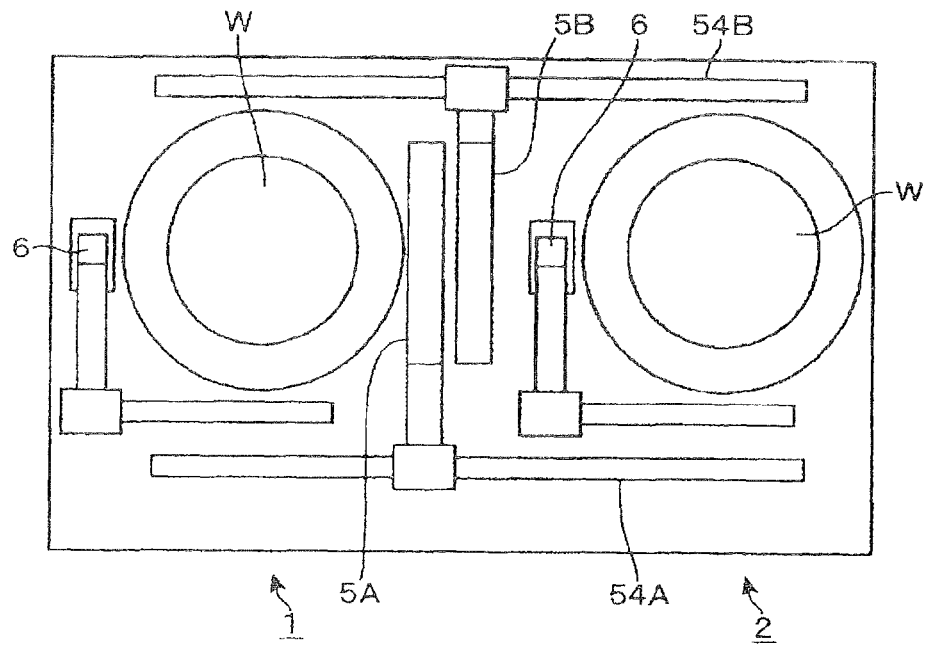
FIG. 28 is a plan view showing an example of another embodiment of the present invention.
Figure 29:
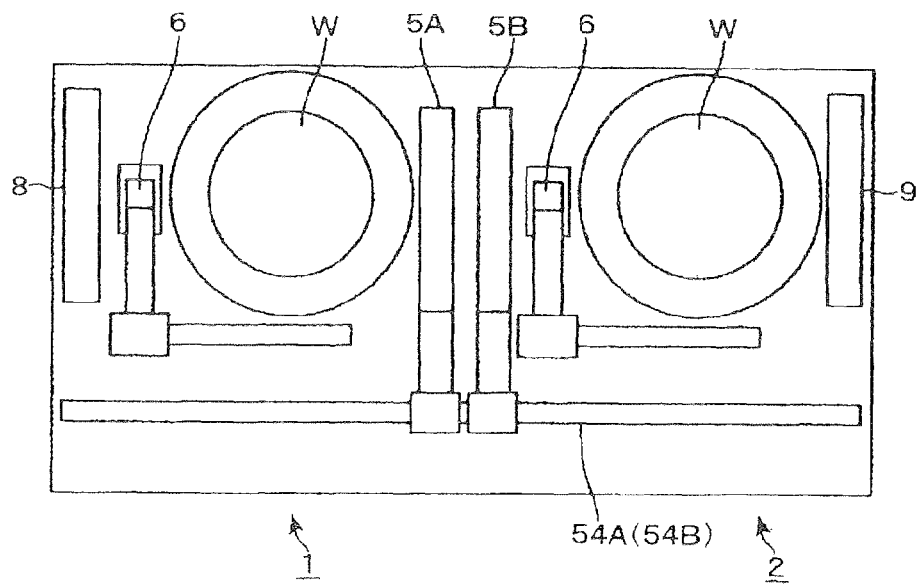
FIG. 29 is a plan view showing an example of another embodiment of the present invention.

FIG. 28 shows a structural example in which the guide members 54A and 5413 in the embodiment of FIG. 27 are arranged oppositely with respect to the aligned first liquid processing module 1 and the second liquid processing module 2. FIG. 29 shows a structural example in which the guide members 54A and 54B are used in common. The reference numbers 8 and 9 depict retracted positions of the respective common developing nozzles 5A and 5B.

In the above description, although a developing apparatus is taken by way of example as the liquid processing apparatus, the present invention may be applied to a cleaning apparatus for cleaning substrates, such as wafers, one by one. In this case, a surface of the substrate is cleaned as follows, for example. Namely, a cleaning liquid having a lower chemical-liquid concentration is discharged from an individual chemical-liquid nozzle, and a cleaning liquid having a chemical-liquid concentration higher than the above concentration is discharged from a common chemical-liquid nozzle. The surface of the substrate is cleaned by discharging the chemical liquid from the common chemical-liquid nozzle for a first period of time, and then the surface of the substrate is cleaned by discharging the chemical liquid from the individual chemical-liquid nozzle for a second period of time that is shorter than the first period of time.

The invention claimed is:

1. A liquid processing apparatus comprising:
a first processing area and a second processing area that are aligned such that substrates that are horizontally placed are respectively processed by a chemical liquid from a nozzle;
a first individual nozzle and a second individual nozzle that are provided individually to correspond to the first processing area and the second processing area;
a first individual-nozzle transfer mechanism and a second individual-nozzle transfer mechanism that are respectively configured to transfer the first individual nozzle and the second individual nozzle between waiting positions and chemical-liquid discharging positions in the respective processing areas;
a common nozzle that is used in common in the first processing area and the second processing area, the common nozzle being configured to supply the chemical liquid onto the substrates;
a common-nozzle transfer mechanism configured to transfer the common nozzle among a waiting position, a chemical-liquid discharging position in the first processing area and a chemical-liquid discharging position in the second processing area; and
a control unit configured to control the first individual-nozzle transfer mechanism, the second individual-nozzle transfer mechanism and the common-nozzle transfer mechanism;
wherein the control unit is configured to control the respective nozzle transfer mechanisms such that a time period in which the common nozzle is engaged with the process in each processing area is shorter than a time period in which the individual nozzle is engaged with the process in each processing area.

2. The liquid processing apparatus according to claim 1, wherein
the waiting position of the common nozzle is disposed between the first processing area and the second processing area in plan view.

3. The liquid processing apparatus according to claim 1, wherein
the chemical liquid discharged from the common nozzle and the individual nozzles is a developer, and
the common nozzle and the individual nozzles supply the developer in methods different from each other.

4. The liquid processing apparatus according to claim 3, wherein
the common nozzle includes a discharge opening formed to have a length covering a width of the substrate, the common nozzle being a nozzle configured to supply the developer from the discharge opening, while being moved from one end of the substrate to the other end thereof.

5. The liquid processing apparatus according to claim 3, wherein
the individual nozzle is a nozzle configured to change the chemical-liquid discharging position from a periphery of the substrate to a central portion thereof while the substrate being rotated, and thereafter to supply the chemical liquid onto the central portion of the substrate.

6. The liquid processing apparatus according to claim 1, wherein
the common nozzle comprises a plurality of common nozzles configured to discharge chemical liquids of different kinds.

7. The liquid processing apparatus according to claim 1, wherein
the common nozzle, the first individual nozzle and the second individual nozzles are configured to be movable along a direction in which the first processing area and the second processing areas are aligned.

8. A liquid processing method for processing substrates by a chemical liquid from a nozzle, the substrates being horizontally placed in a first processing area and a second processing area that are aligned with each other, the method comprising:
loading alternately a plurality of substrates of one lot, one by one, into the first processing area and the second processing area;
transferring a first individual nozzle individually provided to correspond to the first processing area from a waiting position to a chemical-liquid discharging position in the first processing area, and supplying the chemical liquid onto a whole surface of one substrate of the one lot so as to process the substrate;

transferring a second individual nozzle individually provided to correspond to the second processing area to a chemical-liquid discharging position in the second processing area, and supplying the chemical liquid onto the whole surface of another substrate of the one lot;

loading alternately a plurality of substrates of another lot, one by one, into the first processing area and the second processing area;

transferring a common nozzle, which is used in common in the first processing area and the second processing area, from a waiting position to a chemical-liquid discharging position in the first processing area, and supplying the chemical liquid onto one substrate of the other lot; and transferring the common nozzle to a chemical-liquid discharging position in the second processing area, and supplying the chemical liquid onto another substrate of the other lot;

wherein a time period in which the common nozzle is engaged with the process in each processing area is shorter than a time period in which the individual nozzles are engaged with the process in each processing area.

9. The liquid processing method according to claim 8, wherein the waiting position of the common nozzle is disposed between the first processing area and the second processing area in plan view.

10. The liquid processing method according to claim 8, wherein the chemical liquid discharged from the common nozzle and the individual nozzles is a developer, and the common nozzle and the individual nozzles supply the developer in methods different from each other.

* * * * *